United States Patent
Yang et al.

(10) Patent No.: US 11,719,757 B2
(45) Date of Patent: Aug. 8, 2023

(54) FAULT RECOGNITION

(71) Applicant: NEW H3C TECHNOLOGIES CO., LTD., Zhejiang (CN)

(72) Inventors: Ping Yang, Beijing (CN); Chunxi Yan, Beijing (CN); Muzi Zhou, Beijing (CN)

(73) Assignee: New H3C Technologies Co., Ltd., Zhejiang (CN)

( * ) Notice: Subject to any disclaimer, the term of this patent is extended or adjusted under 35 U.S.C. 154(b) by 158 days.

(21) Appl. No.: 17/287,330

(22) PCT Filed: Oct. 14, 2019

(86) PCT No.: PCT/CN2019/111020
§ 371 (c)(1),
(2) Date: Apr. 21, 2021

(87) PCT Pub. No.: WO2020/083061
PCT Pub. Date: Apr. 30, 2020

(65) Prior Publication Data
US 2021/0356530 A1    Nov. 18, 2021

(30) Foreign Application Priority Data
Oct. 24, 2018    (CN) .......................... 201811244607.9

(51) Int. Cl.
*G01R 31/40*    (2020.01)
*G01R 31/26*    (2020.01)
*G06F 1/30*    (2006.01)

(52) U.S. Cl.
CPC ......... *G01R 31/40* (2013.01); *G01R 31/2633* (2013.01); *G06F 1/30* (2013.01)

(58) Field of Classification Search
CPC .... G01R 31/40; G01R 31/2633; G01R 31/54; G01R 31/52; G06F 1/30; G06F 1/263; G06F 1/28; G08B 3/10; G08B 21/185
(Continued)

(56) References Cited

U.S. PATENT DOCUMENTS 2,645,753 A * 7/1953 Dutschke ............. G01R 31/346
                                                            336/84 R
3,551,804 A * 12/1970 Weddle ................. G01R 31/08
                                                            324/528
(Continued)

FOREIGN PATENT DOCUMENTS

CN        2519288 Y      10/2002
CN       101144851 A      3/2008
(Continued)

OTHER PUBLICATIONS

Japanese Patent Office Action, Office Action Issued in Application No. 2021-517047, dated Sep. 6, 2022, 4 pages.(Submitted with Machine Translation).
(Continued)

*Primary Examiner* — Giovanni Astacio-Oquendo
(74) *Attorney, Agent, or Firm* — Greenblum & Bernstein, P.L.C.

(57) ABSTRACT

A fault identification apparatus includes a detector and a plug interface connected with the detector, where the plug interface includes a first measuring terminal and a second measuring terminal; when fault identification is performed for a PSU in a communication apparatus under test, the first measuring terminal is connected with a first end of the PSU, and the second measuring terminal is connected with a second end of the PSU; and the detector obtains a voltage value between the first measuring terminal and the second
(Continued)

measuring terminal to determines whether a failure occurs to the PSU based on the voltage value.

10 Claims, 7 Drawing Sheets

(58) Field of Classification Search
USPC .......... 324/764.01, 544, 541, 538, 537, 500
See application file for complete search history.

(56) References Cited

U.S. PATENT DOCUMENTS

| | | | |
|---|---|---|---|
| 4,333,049 | A | 6/1982 | Yui et al. |
| 7,952,488 | B1 | 5/2011 | Zansky et al. |
| 8,461,492 | B1* | 6/2013 | Briones, Jr. .......... H05B 1/0266 219/494 |
| 8,482,297 | B2 | 7/2013 | Xie |
| 9,122,472 | B2 | 9/2015 | Luo et al. |
| 9,910,103 | B2 | 3/2018 | Mirjafari et al. |
| 2008/0112099 | A1* | 5/2008 | Li ........................ H01H 83/04 361/42 |
| 2011/0175640 | A1 | 7/2011 | Xie |
| 2013/0158931 | A1 | 6/2013 | Chen et al. |
| 2013/0249576 | A1 | 9/2013 | Gao et al. |
| 2014/0184265 | A1 | 7/2014 | Zhou |
| 2014/0253101 | A1 | 9/2014 | Luo et al. |
| 2015/0067378 | A1 | 3/2015 | Kobayashi |
| 2015/0372416 | A1* | 12/2015 | Ashby .................. H01R 13/719 439/181 |
| 2017/0153294 | A1 | 6/2017 | Mirjafari et al. |
| 2017/0205471 | A1 | 7/2017 | Huang et al. |
| 2020/0088808 | A1 | 3/2020 | Hida |
| 2021/0278453 | A1* | 9/2021 | Denney .............. G01R 31/1227 |

FOREIGN PATENT DOCUMENTS

| | | |
|---|---|---|
| CN | 101464499 A | 6/2009 |
| CN | 102073020 A | 5/2011 |
| CN | 102129047 A | 7/2011 |
| CN | 102375128 A | 3/2012 |
| CN | 103163488 A | 6/2013 |
| CN | 103529403 A | 1/2014 |
| CN | 103718055 A | 4/2014 |
| CN | 103901355 A | 7/2014 |
| CN | 104198852 A | 12/2014 |
| CN | 104735591 A | 6/2015 |
| CN | 105488927 A | 4/2016 |
| CN | 105867572 A | 8/2016 |
| CN | 205679718 U | 11/2016 |
| CN | 106292986 A | 1/2017 |
| CN | 106776169 A | 5/2017 |
| CN | 106950511 A | 7/2017 |
| CN | 107092334 A | 8/2017 |
| CN | 107219402 A | 9/2017 |
| CN | 107796982 A | 3/2018 |
| CN | 108491058 A | 9/2018 |
| DE | 112016005441 T5 | 8/2018 |
| JP | 4854519 U | 7/1973 |
| JP | H0270223 A | 3/1990 |
| JP | 2001352674 A | 12/2001 |
| JP | 2014211382 A | 11/2014 |
| JP | 2015035849 A | 2/2015 |
| KR | 101625919 B1 | 5/2016 |
| KR | 20180066684 A | 6/2018 |
| TW | 201020564 A | 6/2010 |
| WO | 2013128851 A1 | 9/2013 |

OTHER PUBLICATIONS

Japanese Patent Office Action, Office Action issued in Application No. 2021-517047, dated Apr. 5, 2022, 8 pages.
State Intellectual Property Office of the People's Republic of China, Office Action and Search Report Issued in Application No. 2018112446079, dated Apr. 1, 2020, 13 pages. (Submitted with Machine Translation).
State Intellectual Property Office of the People's Republic of China, Office Action and Search Report Issued in Application No. 2018112446079, dated Oct. 14, 2020, 8 pages. (Submitted with Translation).
ISA State Intellectual Property Office of the People's Republic of China, International Search Report Issued in Application No. PCT/CN2019/111020, dated Jan. 19, 2020, WIPO, 6 pages.
European Patent Office, Extended European Search Report Issued in Application No. 19876715.4, dated Dec. 7, 2021, Germany, 9 pages.
ISA State Intellectual Property Office of the People's Republic of China, Written Opinion of the International Searching Authority Issued in Application No. PCT/CN2019/111020, dated Jan. 19, 2020, WIPO, 9 pages.

* cited by examiner

FAULT RECOGNITION

CROSS REFERENCE TO RELATED APPLICATIONS

This application claims priority to Chinese Patent Application No. 201811244607.9 filed on Oct. 24, 2018, the entire content of which is incorporated herein by reference.

BACKGROUND

A communication apparatus, such as a network switch, a router or a server, generally includes a Power Supply Unit (PSU). The PSU is a device for converting a voltage from an external power supply system into a voltage desired by different components inside the communication apparatus. A large number of the communication apparatuses may be connected to a same Power Distribution Unit (PDU). The PDU may be connected with the external power supply system through an air circuit breaker (also known as an air switch).

BRIEF DESCRIPTION OF THE DRAWINGS

To describe the technical solutions in examples of the present disclosure or in the prior art more clearly, drawings required in descriptions of the examples of the present disclosure or the prior art will be briefly introduced below. It is apparent that the drawings described below are merely examples of the present disclosure and other drawings may be obtained by those of ordinary skill in the art based on these drawings in the examples of the present disclosure.

DETAILED DESCRIPTION OF THE EMBODIMENTS

The terms used in the present disclosure are for the purpose of describing particular examples only, and are not intended to limit the present disclosure. Terms determined by "a", "the" and "said" in their singular forms in the present disclosure and the appended claims are also intended to include plurality, unless clearly indicated otherwise in the context. It should also be understood that the term "and/or" as used herein refers to and includes any and all possible combinations of one or more of the associated listed items.

It is to be understood that, although terms "first," "second," "third," and the like may be used in the present disclosure to describe various information, such information should not be limited to these terms. These terms are only used to distinguish one category of information from another. For example, without departing from the scope of the present disclosure, first information may be referred as second information; and similarly, second information may also be referred as first information. Depending on the context, the word "if" as used herein may be interpreted as "when" or "upon" or "in response to determining".

Figure 1:
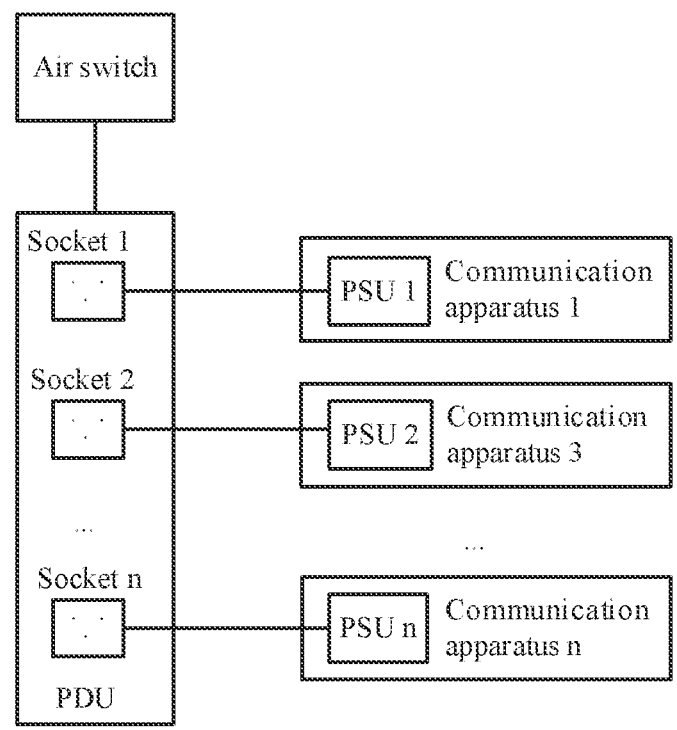
FIG. 1 is a schematic diagram illustrating a connection among communication apparatuses.

As shown in FIG. 1, an alternating current is connected with a PDU through an air switch. The PDU includes a plurality of socket interfaces, such as socket 1, socket 2, . . . and socket n. The PDU may be connected with a plurality of communication apparatuses, such as communication apparatus 1, communication apparatus 2, . . . and communication apparatus n. A PSU 1 of the communication apparatus 1 is connected with the socket 1 of the PDU, a PSU 2 of the communication apparatus 2 is connected with the socket 2 of the PDU, . . . and a PSU n of the communication apparatus n is connected with the socket n of the PDU.

When a PSU of a particular communication apparatus fails, it may cause the air switch to trip. Thus, all communication apparatuses connected with the PDU is powered off, that is, all communication apparatuses stop working. In a case of this failure, maintenance personnel are required to quickly locate which PSU of the communication apparatuses has failed. Next, processing is performed for the failed PSU. However, according to a conventional manner, it cannot be effectively located which PSU of the communication apparatuses has failed.

A fault identification apparatus is provided by examples of the present disclosure. The fault identification apparatus may include but not limited: a Direct Current (DC) power source, a resistor, a detector, and a plug interface connected with the detector. The plug interface may include a first measuring terminal and a second measuring terminal.

Figure 2:
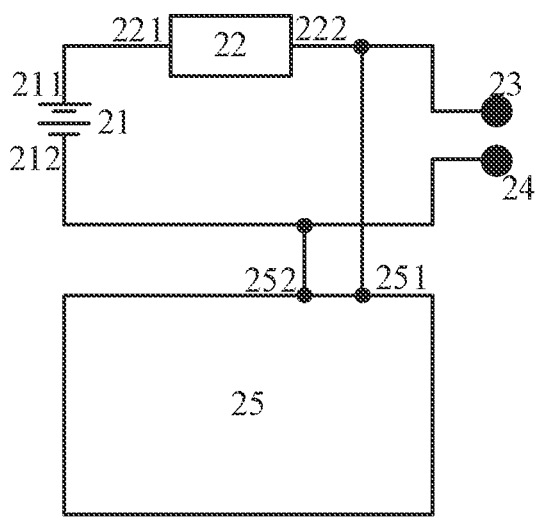
FIG. 2 is a structural diagram illustrating a fault identification apparatus according to an example of the present disclosure.

FIG. 2 is a structural diagram of the fault identification apparatus. As shown in FIG. 2, a positive pole 211 of a DC power source 21 is connected with a first end 221 of a resistor 22, a second end 222 of the resistor 22 is connected with a first measuring terminal 23, and a negative pole 212 of the DC power source 21 is connected with a second measuring terminal 24.

Further, an input pin (e.g., an input end) 251 of a detector 25 may be connected with the first measuring terminal 23 and a ground pin (e.g., a ground end) 252 of the detector 25 is connected with the second measuring terminal 24.

The DC power source 21 may be composed of a plurality of lithium ion batteries or a plurality of dry batteries which are connected in series. A voltage value of the DC power source 21 may be adjusted to, for example, 5 Volts (V) or another voltage value, which is not limited herein.

The resistor 22 may include one resistor or two resistors connected in series or a plurality of resistors connected in series, which is not limited herein. For example, the resistor 22 may include a current-limiting resistor and an adjustable resistor connected in series. Resistance values of the current-limiting resistor and the adjustable resistor can be adjustable, which are not limited herein.

The detector 25 may include but not limited to a microcontroller, and the type of the detector 25 is not limited. The detector 25 is used for implementing functions such as signal detection, service processing, and signal output.

The first measuring terminal 23 and the second measuring terminal 24 are two measuring terminals of the fault identification apparatus, which are used to be connected with a first end (for example, a live wire of alternating current input, i.e., L wire terminal) and a second end (for example, a neutral wire of alternating current input, i.e., N wire terminal) of a PSU of a communication apparatus under test respectively.

Specifically, when fault identification is performed for the PSU in the communication apparatus, the first measuring terminal 23 is connected with the first end of the PSU and the second measuring terminal 24 is connected with the second end of the PSU.

For example, when fault identification is performed for a PSU of communication apparatus A, the first measuring terminal 23 is connected with the first end of the PSU of the communication apparatus A and the second measuring terminal 24 is connected with the second end of the PSU of the communication apparatus A. When fault identification is performed for communication apparatus B, the first measuring terminal 23 is connected with a first end of a PSU of the communication apparatus B and the second measuring terminal 24 is connected with a second end of the PSU of the communication apparatus B.

Figure 3:
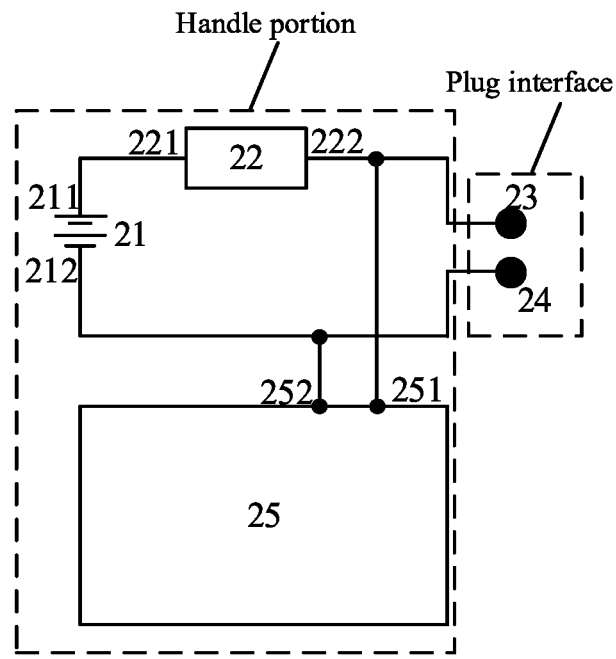
FIG. 3 is a structural diagram illustrating a fault identification apparatus according to another example of the present disclosure.

In an example, as shown in FIG. 3, the fault identification apparatus may be a handheld apparatus, including a handle portion 31 and a plug interface 32. During test, a connection between a PSU of a communication apparatus under test and a PDU can be firstly terminated, and then the plug interface 32 is directly inserted into the PSU of the communication apparatus under test. In this way, the first measuring terminal 23 is connected with the first end of the PSU of the communication apparatus and the second measuring terminal 24 is connected with the second end of the PSU of the communication apparatus.

The plug interface may be an interface conforming to the regulation of International Electrotechnical Commission (IEC) and may also be another type of interface, which is not limited herein.

Figure 4:
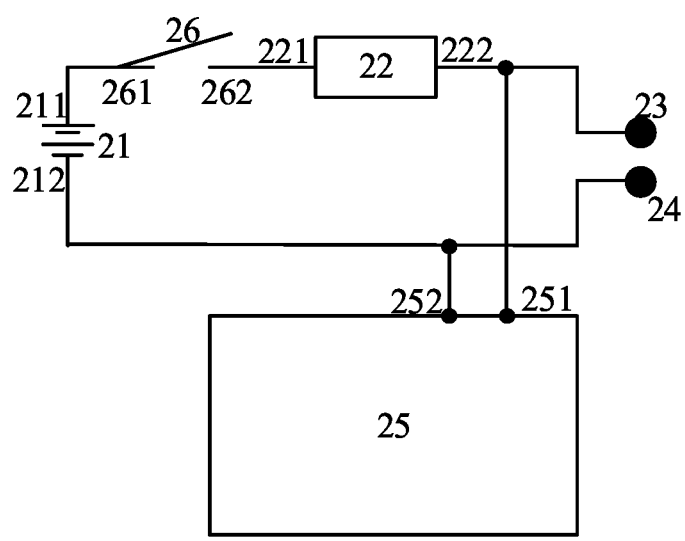
FIG. 4 is a structural diagram illustrating a fault identification apparatus according to still another example of the present disclosure.

In an example, as shown in FIG. 4, the fault identification apparatus may include a switch 26. The type of the switch 26 is not limited herein and therefore the switch may be any type of switch. A first end 261 of the switch 26 is connected with the positive pole 211 of the DC power source 21 and a second end 262 of the switch 26 is connected with the first end 221 of the resistor 22.

When no fault identification is performed for the PSU, the switch 26 may be turned off. In this way, the DC power source 21 and the resistor 22 are in an off state and the fault identification apparatus is in a non-working state.

When fault identification is performed for the PSU, the switch 26 is turned on. In this way, the DC power source 21 and the resistor 22 are in an on state and the fault identification apparatus is in a working state.

The switch 26 may also be located on another portion of the fault identification apparatus. For example, the switch 26 may be located between the resistor 22 and the input pin 251 of the detector 25 or located between the ground pin 252 of the detector 25 and the DC power source 21. The position of the switch is not limited in the present disclosure. Further, the number of the switches may be configured according to actual needs, for example, a plurality of switches are configured, which is not limited herein.

In the above application scenario, the detector 25 is configured to obtain a voltage value between the first measuring terminal 23 and the second measuring terminal 24, and determine whether the PSU of the communication apparatus under test fails based on the voltage value.

Specifically, if the voltage value is equal to or greater than a first threshold and less than or equal to a second threshold, the detector 25 may determine that the PSU does not fail, where the second threshold is greater than the first threshold.

Further, if the voltage value is less than the first threshold, the detector 25 may determine that the PSU fails. Alternatively, if the voltage value is greater than the second threshold, the detector 25 may determine that the PSU fails.

If the voltage value is less than the first threshold, the detector 25 may determine that a short circuit failure occurs to the PSU. If the voltage value is greater than the second threshold, the detector 25 may determine that an open circuit failure occurs to the PSU.

Figure 5:
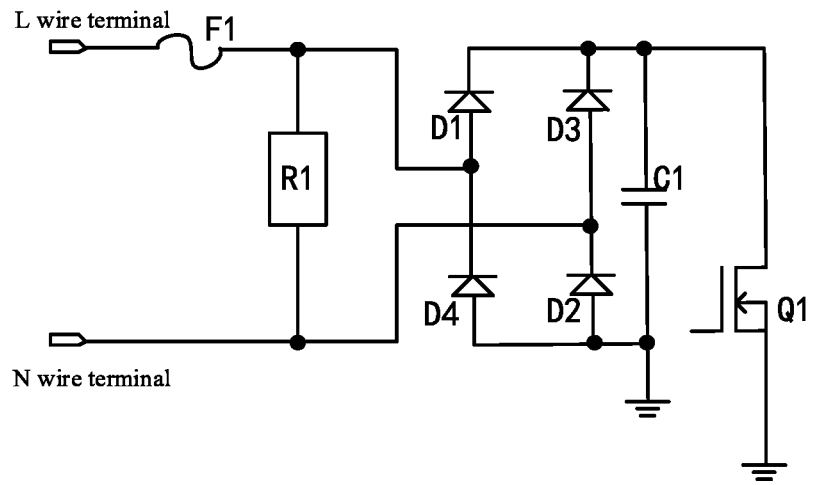
FIG. 5 is a structural diagram illustrating a PSU inside a communication apparatus according to an example of the present disclosure.

The process of fault identification is described below in combination with specific application scenarios. FIG. 5 is a structural diagram illustrating a PSU inside a communication apparatus. The PSU is merely an example in which an ordinary PSU is equivalently simplified. In an actual application, the PSU has a more complex structure, which is not limited herein.

As shown in FIG. 5, a terminal of the live wire (i.e., L wire) of the PSU may be the first end of the PSU and a terminal of the neutral wire (i.e., N wire) of the PSU may be the second end of the PSU. When the fault identification apparatus is connected with the PSU, the first measuring terminal 23 is connected with the L wire terminal of the PSU and the second measuring terminal 24 is connected with the N wire terminal of the PSU.

As shown in FIG. 5, the PSU may also include a fuse F1, an equivalent resistor R1, an equivalent capacitor C1 (for example, electrolytic capacitor C1), a Metal Oxide Semiconductor Field Effect Transistor (MOSFET) Q1 as a switch, and four diodes (for example, a diode D1, a diode D2, a diode D3, and a diode D4). Connection relationships and functions of these components can be referred to a conventional PSU, which will not be described herein.

Figure 6:
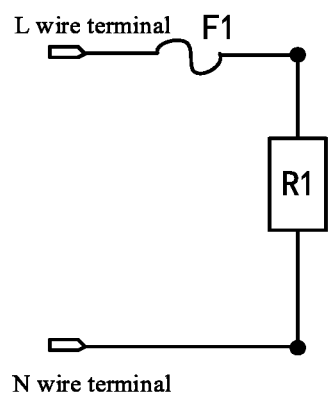
FIG. 6 is a schematic diagram illustrating an equivalent circuit of a PSU according to an example of the present disclosure.

In an application scenario 1, when a PSU does not fail, since the fault identification apparatus connected with the PSU of the communication apparatus under test is supplied with a DC power during test, the PSU shown in FIG. 5 can be equivalent to the PSU shown in FIG. 6. That is, FIG. 6 shows an equivalent circuit of a PSU in a normal state. After the first measuring terminal 23 of the fault identification apparatus is connected to the L wire terminal of the PSU, and the second measuring terminal 24 of the fault identification apparatus is connected to the N wire terminal of the PSU, a new equivalent circuit can be seen in FIG. 7.

Figure 7:
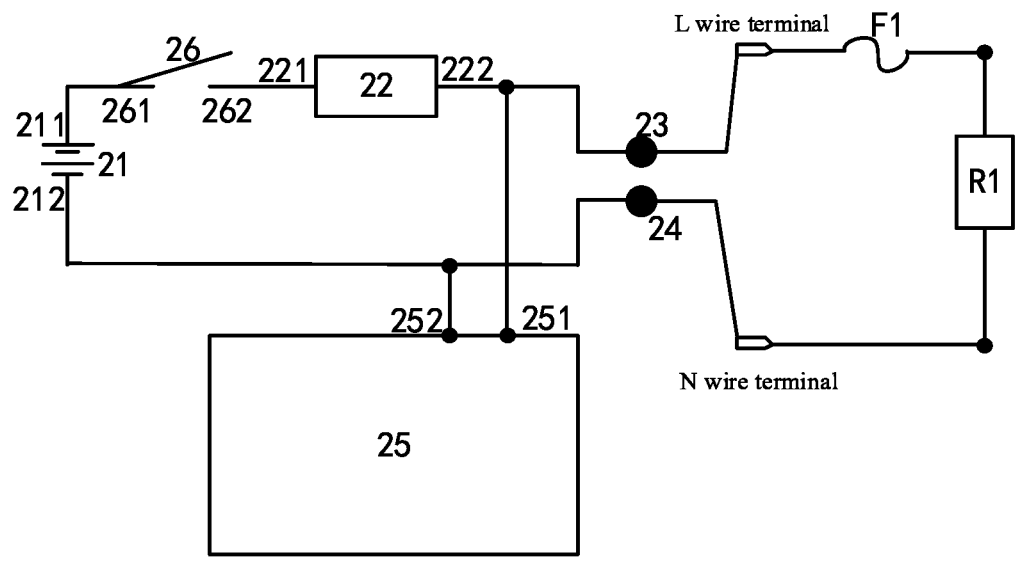
FIG. 7 is a schematic diagram illustrating a connection between a fault identification apparatus and a PSU according to an example of the present disclosure.

As shown in FIG. 7, when the switch 26 is turned on, $U1=U0*Ra/(Ra+Rb)$. U1 refers to a voltage value between the input pin 251 and the ground pin 252 of the detector 25, that is, the voltage value between the first measuring terminal 23 and the second measuring terminal 24. U0 refers to a voltage value of the DC power source 21, for example, 5 V. A value of Ra is equal to a resistance value of the equivalent resistor R1 of the PSU. Rb refers to a resistance value of the resistor 22 of the fault identification apparatus. The resistance value of Rb may be set according to experiences, which is not limited herein.

Because U0, Ra and Rb are all known values, the U1 can be determined by using U0, Ra and Rb. Considering the values of the Ra and the Rb are variable, the U1 is not a unique value. In actual applications, a voltage range may be set and the U1 is within the voltage range. For example, the voltage range may be [first threshold, second threshold]. When the PSU does not fail, the U1 is within the voltage range [first threshold, second threshold].

In conclusion, the detector 25 detects the voltage value U1 between the first measuring terminal 23 and the second measuring terminal 24. If the voltage value U1 is within the voltage range [first threshold, second threshold], that is, the voltage value U1 is equal to or greater than the first threshold and less than or equal to the second threshold, the detector 25 determines that the PSU does not fail.

In an example, the first threshold and the second threshold may be configured according to experiences. The first threshold may be a voltage value indicating a short circuit failure and the second threshold may be a voltage value indicating an open circuit failure. For example, the first threshold may be 1.5 V and the second threshold may be 4.5 V. The first threshold and the second threshold here are merely examples. In another example, the first threshold may also be 2 V and the second threshold may also be 5 V. In the present disclosure, the thresholds are not limited as long as the first threshold indicates the short circuit failure and the second threshold indicates the open circuit failure.

When the voltage value U1 is less than the first threshold, the detector 25 may determine that the short circuit failure occurs to the PSU of the communication apparatus under test fails. When the voltage value U1 is greater than the second threshold, the detector 25 may determine that the open circuit failure occurs to the PSU of the communication apparatus under test.

Figure 8:
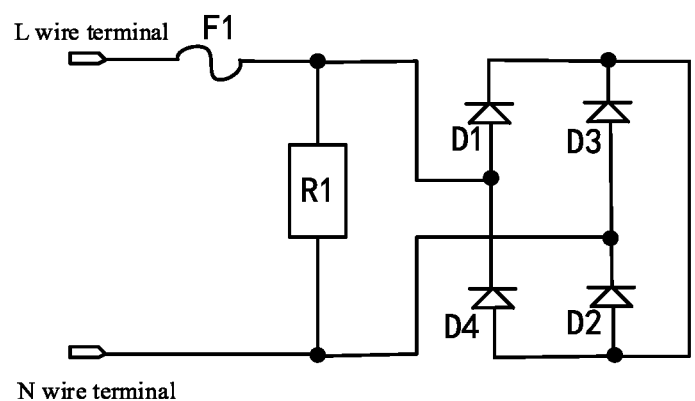
FIG. 8 is a schematic diagram illustrating an equivalent circuit of a PSU according to another example of the present disclosure.

In an application scenario 2, when a short circuit failure occurs to a PSU, for example, a short circuit failure occurs to the capacitor C1 or the MOSFET Q1 as a switch, meanwhile the fuse F1 works normally, the PSU shown in FIG. 5 may be equivalent to the PSU shown in FIG. 8, that is, FIG. 8 shows an equivalent circuit of a PSU in a short circuit failure. After the first measuring terminal 23 of the fault identification apparatus is connected to the L wire terminal of the PSU, and the second measuring terminal 24 of the fault identification apparatus is connected to the N wire terminal of the PSU, a new equivalent circuit can be seen in FIG. 9.

Figure 9:
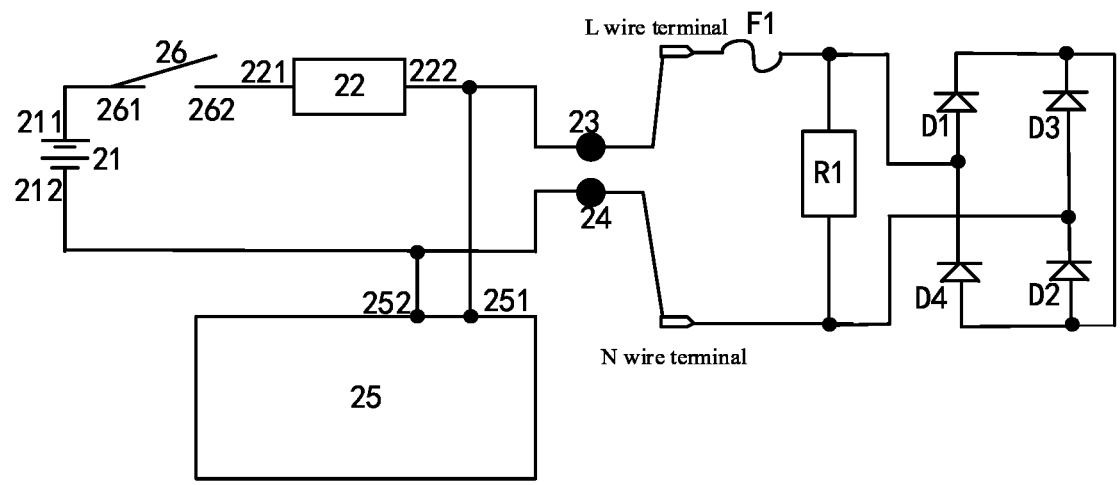
FIG. 9 is a schematic diagram illustrating a connection between a fault identification apparatus and a PSU according to another example of the present disclosure.

As shown in FIG. 9, when the switch 26 is turned on, the voltage value U0 of the DC power source 21 is greater than a sum of a forward voltage of the diode D1 and a forward voltage of the diode D2. In this case, both the diode D1 and the diode D2 are conducted. Based on this, U1=Ua+Ub. U1 refers to the voltage value between the input pin 251 and the ground pin 252 of the detector 25, that is, the voltage value between the first measuring terminal 23 and the second measuring terminal 24. Ua refers to a voltage value across the diode D1, and Ub refers to a voltage value across the diode D2. Ua and Ub are both relatively fixed values, for example, 0.7 V. Therefore, U1=0.7*2=1.4 V.

The above is merely an example. Since the forward voltages of the diode D1 and the diode D2 are relatively fixed, the U1 may be determined by using the voltage values of the diode D1 and the diode D2. The U1 is a voltage value less than the first threshold.

In conclusion, the detector 25 detects the voltage value U1 between the first measuring terminal 23 and the second measuring terminal 24. If the voltage value U1 is less than the first threshold (for example, 1.5 V), the detector 25 determines that the short circuit failure occurs to the PSU of the communication apparatus under test.

Figure 10:
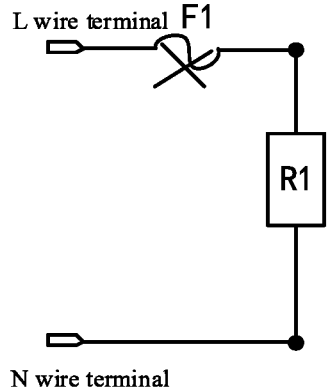
FIG. 10 is a schematic diagram illustrating an equivalent circuit of a PSU according to still another example of the present disclosure.

In an application scenario 3, when an opening circuit failure occurs to a PSU, for example, the fuse F1 disconnects, a resistance between the L wire terminal and the N wire terminal of the PSU is infinite (open circuit). The PSU shown in FIG. 5 may be equivalent to the PSU shown in FIG. 10, that is, FIG. 10 shows an equivalent circuit of a PSU in an open circuit failure. After the first measuring terminal 23 of the fault identification apparatus is connected to the L wire terminal of the PSU, and the second measuring terminal 24 of the fault identification apparatus is connected to the N wire terminal of the PSU, a new equivalent circuit can be seen in FIG. 11.

Figure 11:
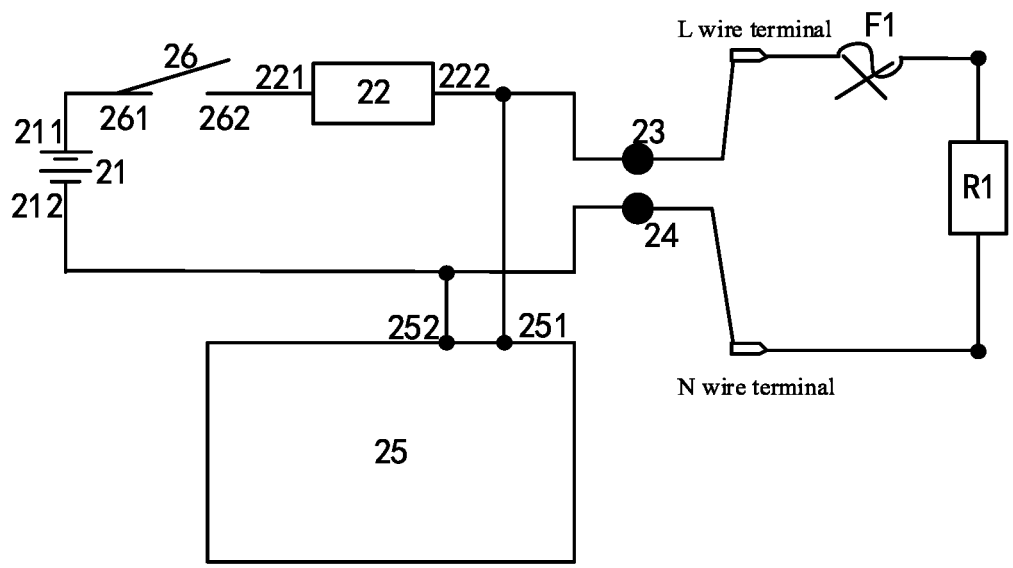
FIG. 11 is a schematic diagram illustrating a connection between a fault identification apparatus and a PSU according to still another example of the present disclosure.

As shown in FIG. 11, when the switch 26 is turned on, since the L wire terminal and the N wire terminal of the PSU are in an open circuit state, U1 may be equal to the voltage value U0 of the DC power source 21. U1 refers to a voltage value between the input pin 251 and the ground pin 252 of the detector 25, that is, the voltage value between the first measuring terminal 23 and the second measuring terminal 24. Therefore, the detector 25 may determine U1 by using the voltage value U0 of the DC power source 2, and U1 can be a voltage value greater than the second threshold.

In conclusion, the detector 25 detects the voltage value U1 between the first measuring terminal 23 and the second measuring terminal 24. If the voltage value U1 is greater than the second threshold (for example, 4.5 V), the detector 25 determines that the open circuit failure occurs to the PSU of the communication apparatus under test.

In combination with the application scenario 1, the application scenario 2 and the application scenario 3, the detector 25 detects the voltage value U1 between the first measuring terminal 23 and the second measuring terminal 24. If the voltage value U1 is within the voltage range [first threshold, second threshold], the detector 25 may determine no failure occurs to the PSU of the communication apparatus under test. If the voltage value U1 is less than the first threshold, the detector 25 may determine that the short circuit failure occurs to the PSU of the communication apparatus under test. If the voltage value U1 is greater than the second threshold, the detector 25 may determine that the open circuit failure occurs to the PSU of the communication apparatus under test.

Figure 12:
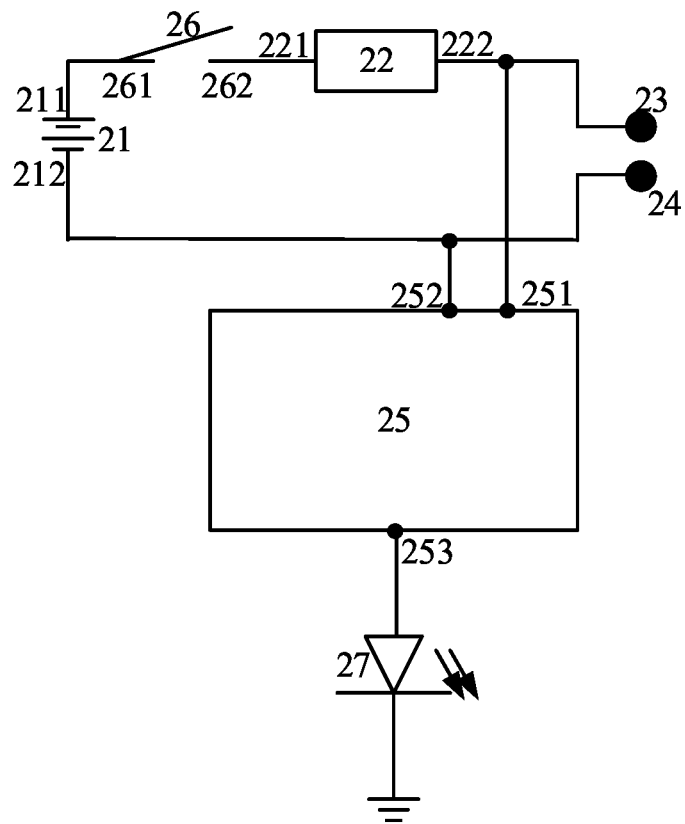
FIG. 12 is a structural diagram illustrating a fault identification apparatus according to yet another example of the present disclosure.

In an example, as shown in FIG. 12, the fault identification apparatus may further include a light emitting diode 27. A first output pin (e.g., a first output end) 253 of the detector 25 is connected with a positive pole of the light emitting diode 27 and a negative pole of the light emitting diode 27 is connected with the ground end.

Based on this, if the voltage value U1 is greater than or equal to the first threshold and less than or equal to the second threshold, the detector 25 outputs a first signal. The light emitting diode 27 displays a first color based on the first signal. For example, the first signal may drive the light emitting diode 27 to display the first color. The first color is used to indicate no failure of the PSU. If the voltage value U1 is less than the first threshold, the detector 25 outputs a second signal. The light emitting diode 27 displays a second color based on the second signal. For example, the second signal may drive the light emitting diode 27 to display the second color. The second color is used to indicate the short circuit failure of the PSU. If the voltage value U1 is greater than the second threshold, the detector 25 outputs a third signal. The light emitting diode 27 displays a third color based on the third signal. For example, the third signal may drive the light emitting diode 27 to display the third color. The third color is used to indicate the open circuit failure of the PSU. It is noted that the first output pin may indicate one pin and may also indicate a plurality of pins forming a bus, and the fault identification apparatus may be connected with the light emitting diode 27 through the bus.

The first color may be a green color. That is, when the light emitting diode 27 lights up in green, it means no failure occurs to the PSU. The second color may be a red color. That is, when the light emitting diode 27 lights up in red, it means the short circuit failure occurs to the PSU. The third color may be a yellow color. That is, when the light emitting diode 27 lights up in yellow, it means the open circuit failure occurs to the PSU.

The above light emitting diode 27 may be a tri-color light emitting diode. That is, the light emitting diode 27 may display green, or red or yellow, which is not limited herein.

In an example, the fault identification apparatus may further include a current-limiting resistor. The current-limiting resistor is connected between the first output pin of the detector 25 and the positive pole of the light emitting diode 27.

Figure 13:
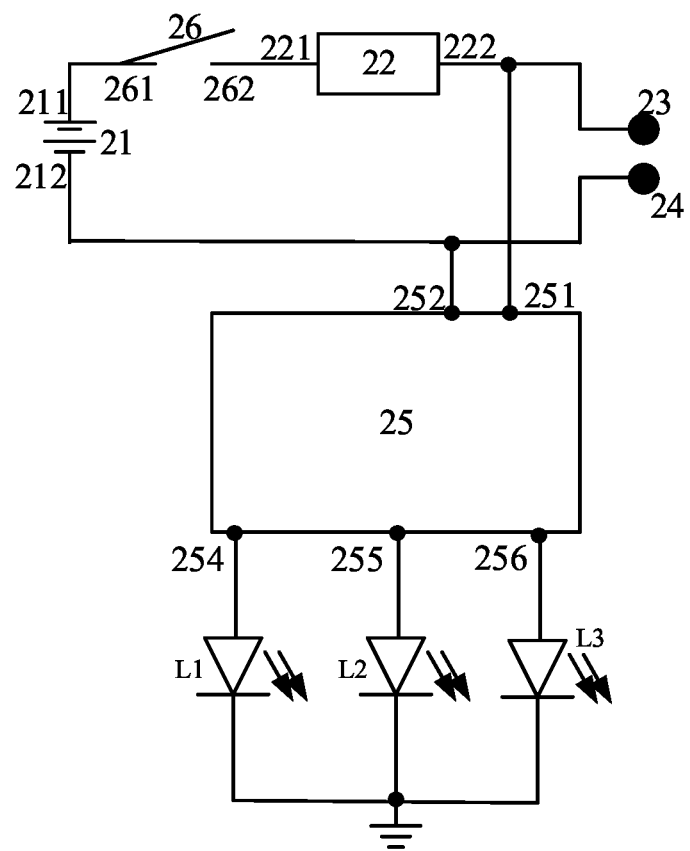
FIG. 13 is a structural diagram illustrating a fault identification apparatus according to yet another example of the present disclosure.

In another example, as shown in FIG. 13, the fault identification apparatus may further include a light emitting diode L1, a light emitting diode L2, and a light emitting diode L3. The light emitting diode L1 may display red, the light emitting diode L2 may display yellow, and the light emitting diode L3 may display green. Further, the detector 25 is connected with the light emitting diode L1, the light emitting diode L2, and the light emitting diode L3 through an output pin 254, an output pin 255 and an output pin 256 respectively. Based on this, if the voltage value U1 is greater than or equal to the first threshold and less or equal to the second threshold, the detector 25 may output a signal to the light emitting diode L3. The signal is used to drive the light emitting diode L3 to turn on, which indicates no failure occurs to the PSU. If the voltage value U1 is less than the first threshold, the detector 25 may output a signal to the light emitting diode L1. The signal is used to drive the light emitting diode L1 to turn on, which indicates that the short circuit failure occurs to the PSU. When the voltage value U1 is greater than the second threshold, the detector 25 may output a signal to the light emitting diode L2. The signal is used to drive the light emitting diode L2 to turn on, which indicates the open circuit occurs to the PSU.

In an example, the fault identification apparatus may further include a current-limiting resistor r1, a current-limiting resistor r2 and a current-limiting resistor r3. The current-limiting resistor r1 is connected between the positive pole of the light emitting diode L1 and the output pin 254 of the detector 25, the current-limiting resistor r2 is connected between the positive pole of the light emitting diode L2 and the output pin 255 of the detector 25, and the current-limiting resistor r3 is connected between the positive pole of the light emitting diode L3 and the output pin 256 of the detector 25.

In an example, the fault identification apparatus may further include an audio alarm component (not shown). A second output pin (e.g., the second output end) of the detector 25 may be connected with the audio alarm component. Based on this, if the voltage value U1 is greater than or equal to the first threshold and less than or equal to the second threshold, the detector 25 does not output a signal. In this way, the alarm component will not raise an alarm, which indicates no failure occurs to the PSU. If the voltage value U1 is less than the first threshold, or the voltage value U1 is greater than the second threshold, the detector 25 may output a fourth signal. The audio alarm component may raise the alarm based on the fourth signal. For example, the fourth signal may drive the audio alarm component to raise the alarm, which indicates a failure occurs to the PSU. It is noted that the second output pin may indicate one pin or a plurality of pins forming a bus, and the fault identification apparatus may be connected with the audio alarm component through the bus.

In an example, the fault identification apparatus may further include a display component (not shown). A third output pin (e.g., the third output end) of the detector 25 may be connected with the display component. Based on this, if the voltage value U1 is greater than or equal to the first threshold and less than or equal to the second threshold, the detector 25 may output a fifth signal. The display component may display a first value based on the fifth signal. For example, the fifth signal may drive the display component to display the first value. The first value may be used to indicate no failure of the PSU. If the voltage value U1 is less than the first threshold, the detector 25 may output a sixth signal. The display component may display a second value based on the sixth signal. For example, the sixth signal may drive the display component to display the second value. The second value is used to indicate the short circuit failure occurs to the PSU. If the voltage value U1 is greater than the second threshold, the detector 25 may output a seventh signal. The display component may display a third value based on the seventh signal. For example, the seventh signal may drive the display component to display the third value. The third value may be used to indicate the open circuit failure occurs to the PSU. It is noted that the third output pin may indicate one pin or a plurality of pins forming a bus, and the fault identification apparatus may be connected with the display component through the bus.

Based on technical solutions of the examples of the present disclosure, which communication apparatus fails can be effectively determined by the fault identification apparatus without normally powering the communication apparatus. Thus, the maintenance personnel can quickly determine a failed communication apparatus and then perform processing for the failed communication apparatus, thereby improving service guarantee capability and working efficiency.

For convenience of description, the above apparatuses are divided into different modules based on functionality for descriptions. Of course, the functions of different modules may be implemented in a same or a plurality of hardware and/or software when practicing the present disclosure.

The persons skilled in the art should understand that the examples of the present disclosure may be provided as a method, a system, or a computer program product. Thus, entire hardware examples, entire software examples or examples combining software and hardware may be adopted in the present disclosure. Further, the present disclosure may be implemented in the form of a computer program product that is operated on one or more computer available storage media (including but not limited to magnetic disk memory, CD-ROM, and optical memory and so on) including computer available program codes.

The present disclosure is described by referring to flowcharts and/or block diagrams of a method, a device (a system) and a computer program product in an example of the present disclosure. It is understood that each flowchart and/or block in the flowcharts and/or the block diagrams or a combination of a flowchart and/or a block of the flowcharts and/or the block diagrams may be implemented by computer program instructions. These computer program instructions may be provided to a general-purpose computer, a dedicated computer, an embedded processor, or a processor of another programmable data processing device to generate a machine so that the instructions executable by a computer or a processor of another programmable data processing device generate an apparatus for implementing functions designated in one or more flows of the flowcharts and/or one or more blocks of the block diagrams.

Further, these computer program instructions may also be stored in a computer readable memory that can direct a computer or another programmable data processing device to work in a particular manner so that the instructions stored in the computer readable memory generate a product including an instruction apparatus and the instruction apparatus can implement functions designated in one or more flows of the flowcharts and/or one or more blocks of the block diagrams.

The computer program instructions may also be loaded on a computer or another programmable data processing devices, so that a series of operation blocks can be executed on the computer or another programmable device to generate processing achieved by the computer, and thus instructions executable on the computer or another programmable device are provided for blocks for realizing functions designated in one or more flows of the flowcharts and/or one or more blocks of the block diagrams.

The foregoing descriptions are only examples of the present disclosure but not intended to limit the present disclosure. For the persons skilled in the art, various modifications and changes may be made to the present disclosure. Any modifications, equivalent substitutions, and improvements made within the spirit and principles of the disclosure shall be encompassed in the scope of protection of the present disclosure.

The invention claimed is:

1. A fault identification apparatus, comprising:
a detector; and
a plug interface connected with the detector and comprising a first measuring terminal and a second measuring terminal;
wherein, when performing a fault identification with respect to a power supply unit (PSU) in a communication apparatus under test, the first measuring terminal is connected with a first end of the PSU and the second measuring terminal is connected with a second end of the PSU; and
the detector obtains a voltage value between the first measuring terminal and the second measuring terminal, wherein the detector is further configured to determine whether a failure occurs to the PSU based on the voltage value.

2. The apparatus according to claim 1, wherein the detector is further configured to determine whether the failure occurs to the PSU based on the voltage value, comprising:
when the voltage value is greater than or equal to a first threshold and less than or equal to a second threshold, determining no failure occurs to the PSU, wherein the second threshold is greater than the first threshold;
when the voltage value is less than the first threshold, determining the failure occurs to the PSU; and
when the voltage value is greater than the second threshold, determining the failure occurs to the PSU.

3. The apparatus according to claim 2, wherein the detector is further configured to:
when the voltage value is less than the first threshold, determine a short circuit failure occurs to the PSU; and
when the voltage value is greater than the second threshold, determine an open circuit failure occurs to the PSU.

4. The apparatus according to claim 1, wherein, the detector comprises:
an input pin connected with the first measuring terminal; and
a ground pin connected with the second measuring terminal.

5. The apparatus according to claim 1, further comprises a direct current power source and a resistor, wherein
a positive pole of the direct current power source is connected with a first end of the resistor,
a second end of the resistor is connected with the first measuring terminal, and
a negative pole of the direct current power source is connected with the second measuring terminal.

6. The apparatus according to claim 5, further comprises a switch, wherein
a first end of the switch is connected with the positive pole of the direct current power source,
a second end of the switch is connected with the first end of the resistor,
the switch is turned off when no fault identification is performed for the PSU, and
the switch is turned on when fault identification is to be performed for the PSU.

7. The apparatus according to claim 1, wherein the apparatus further comprises a light emitting diode, and
a first output pin of the detector is connected with a positive pole of the light emitting diode and a negative pole of the light emitting diode is connected with a ground end;
the detector is configured to determine whether the failure occurs to the PSU based on the voltage value, comprising:
when the voltage value is greater than or equal to a first threshold and less than or equal to a second threshold, outputting a first signal, such that the light emitting diode displays a first color based on the first signal to indicate no failure occurs to the PSU;
when the voltage value is less than the first threshold, outputting a second signal, such that the light emitting diode displays a second color based on the second signal to indicate a short circuit failure occurs to the PSU; and
when the voltage value is greater than the second threshold, outputting a third signal, such that the light emitting diode displays a third color based on the third signal to indicate an open circuit failure occurs to the PSU.

8. The apparatus according to claim 1, further comprises an audio alarm component, wherein
a second output pin of the detector is connected with the audio alarm component;
the detector is configured to determine whether the failure occurs to the PSU based on the voltage value, comprising:
when the voltage value is less than a first threshold or the voltage value is greater than a second threshold, outputting a fourth signal, such that the audio alarm component raises an alarm based on the fourth signal to indicate the failure occurs to the PSU.

9. The apparatus according to claim 1, further comprises a display component, wherein
 a third output pin of the detector is connected with the display component;
 the detector is configured to determine whether the failure occurs to the PSU based on the voltage value, comprising:
  when the voltage value is greater than or equal to a first threshold and less than or equal to a second threshold, outputting a fifth signal, such that the display component displays a first value based on the fifth signal to indicate no failure occurs to the PSU;
  when the voltage value is less than the first threshold, outputting a sixth signal, such that the display component displays a second value based on the sixth signal to indicate a short circuit failure occurs to the PSU; and
  when the voltage value is greater than the second threshold, outputting a seventh signal, such that the display component displays a third value based on the seventh signal to indicate an open circuit failure occurs to the PSU.

10. The apparatus according to claim 1, wherein the detector is a microcontroller.

\* \* \* \* \*